May 16, 1972 G SANJIV KAMATH 3,663,722

METHOD OF MAKING SILICON CARBIDE JUNCTION DIODES

Filed March 5, 1970

3,663,722

METHOD OF MAKING SILICON CARBIDE JUNCTION DIODES

G Sanjiv Kamath, Wellesley, Mass., assignor to Norton Research Corporation, Cambridge, Mass.

Continuation-in-part of applications Ser. No. 810,977, Mar. 27, 1969, and Ser. No. 840,255, July 9, 1969. This application Mar. 5, 1970, Ser. No. 16,855
Int. Cl. H01l 7/38; C01b 31/36; B01j 17/24
U.S. Cl. 148—172 2 Claims

ABSTRACT OF THE DISCLOSURE

The production of electroluminescent silicon carbide junction diodes is described. These diodes are preferably produced by growth from a silicon carbide or carbon solution in silicon formed between a surface of a p or n-type silicon carbide base crystal and a source of carbon atoms such as a block of solid carbon. The silicon contains one or more p or n-type impurities so that a p-n junction is formed on the crystal. A multistratum epitaxial layer is grown on the base crystal by providing immediately adjacent the base crystal a layer of silicon having one impurity concentration and providing at a remote spot in the reaction zone another mass of silicon having a different impurity concentration. The initial stratum is grown at a relatively low temperature and the second stratum is grown at a higher temperature. The initial stratum can be very thin (less than .0005 inch) and transparent and the second stratum can be opaque and of low resistance dut to codoping with boron and aluminum.

Figure 1:
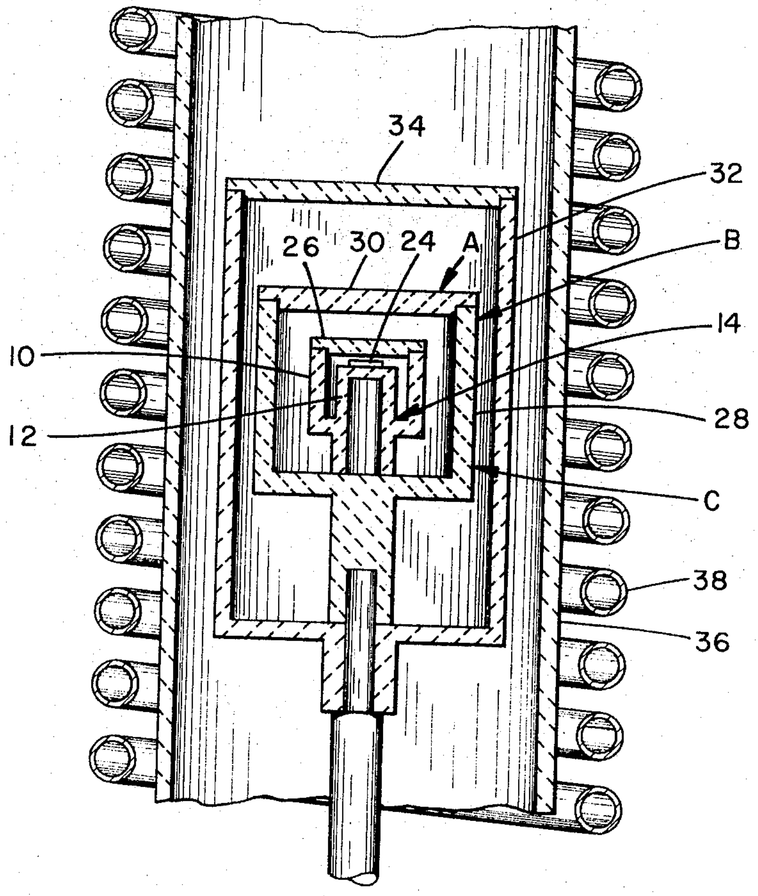

This application is a continuation-in-part of my copending applications Ser. No. 840,255, filed July 9, 1969 and Ser. No. 810,977, filed Mar. 27, 1969, now U.S. Pat. No. 3,565,703 issued Feb. 23, 1971.

This invention relates to an improved method of forming silicon carbide junction diodes, particularly light-emitting diodes.

SUMMARY OF THE INVENTION

The invention is particularly concerned with silicon carbide junction devices and their production. In one preferred embodiment a light-emitting junction diode is formed by growing an epitaxial n layer on the surface of an $n^+$ crystal and then forming a p layer on the n layer.

A silicon carbide junction diode can be employed as an electroluminescent light source. For such use, it is desired that the junction have the lowest possible forward resistance. Also it is highly desirable that the epitaxial layer be monocrystalline and free of crystalline defects, this being particularly true where another epitaxial layer is to be grown over the first epitaxial layer.

It is a principal object of the present invention to provide such diodes having a high output of visible light from a clear, extremely thin, epitaxial layer which is deposited on an opaque base layer and which forms a p-n junction with an opaque, low-resistance epitaxial layer deposited on the clear layer.

Another object of the invention is to provide improved methods of making diodes with a high degree of crystalline perfection and control of impurity content.

Another object of the invention is to provide a method for making a p-n-p or n-p-n transistor by growing epitaxial layers on a silicon carbide base crystal.

Still another object of the invention is to provide a method of making a silicon carbide diode of extremely low forward resistance.

Still another object of the invention is to provide a method of making electroluminescent silicon carbide diodes which are very useful for recording data, such as sound, on photographic film.

These and other objects of the invention will be obvious and will in part appear hereinafter.

For a fuller understanding of the nature and objects of the invention, reference should be had to the following detailed discussion thereof taken in connection with the accompanying drawing in which:

FIG. 1 is a diagrammatic, schematic representation of one embodiment of the invention.

The general method of the present invention is described in my copending application Ser. No. 840,255, filed July 9, 1969. In one preferred embodiment a three-layer silicon carbide junction diode is prepared by starting with a single substrate crystal of silicon carbide of one impurity type and growing a layer of silicon carbide containing a lesser concentration of the same impurity type onto one surface of the substrate crystal. The growth then continues with a high concentration of another impurity type to form the p-n junction. If the starting crystal has a high "n" doping level, it will be relatively opaque. When it is subjected to a diffusion-epitaxial growth treatment wherein an n-type layer is grown on one suface of the crystal, the n layer will be relatively transparent if it is only lightly doped. If the epitaxial growth then continues with the production of heavily doped opaque p layer, there will be produced a p-n junction between the clear n layer and the overgrown opaque p layer. The thin clear layer will serve as a very narrow window through which the light exits from the junction.

In a preferred form of the invention, the lightly doped "n" layer is formed by providing essentially pure silicon between the base "n" crystal and a carbon pedestal which supports the crystal in the growth zone. Another supply of silicon containing aluminum and boron is provided in a groove surrounding the pedestal. The lightly doped epitaxial layer is grown by heating the reaction zone to a relatively low temperature of about 1500°–1700° C. for a short period (1–15 minutes) and then the temperature of the zone is raised to about 2400° C. for another short period (about 5 minutes) to achieve rapid growth of a heavily doped p layer due to wetting of the top of the pedestal by heavily doped silicon from the groove.

In order that the invention may be more fully understood, reference should be had to FIG. 1 and to the following nonlimiting examples:

Example 1

A small graphite crucible 10 constructed from high purity graphite (less than 5 p.p.m. ash) was obtained from the Ultra Carbon Corporation. The crucible had the general shape shown in FIG. 1. The pedestal 12 was about 7⁄16" in diameter and the groove 14 was about 3⁄8" deep.

The crucible was provided with a graphite cover 26 and was supported inside of a graphite susceptor chamber 28 1¾" in diameter by 1¼" deep. This susceptor had a graphite cover 30 and was positioned inside of split graphite heat shield 32 provided with a cover 34. This is surrounded by a quartz tube 36 about 24" long and 2½" in diameter. On the outside of the tube 36 was positioned an induction coil 38 energized by a 50 kw. radio frequency generator.

The graphite crucible 10 and pedestal 12 used in the layer growth are pretreated with silicon at about 1900° C. to impregnate the internal surface with a silicon carbide layer which enables it to withstand much higher temperatures during subsequent use. Such a crucible can be used repeatedly for further experiments. After this treatment, a small piece (30 mgm.) of pure silicon is placed on top of the pedestal and a substrate silicon carbide crystal 24 (about 10 mgm.) is placed on top of this silicon in the position shown. A second charge of silicon (600 mgm.) containing 5 mgm. aluminum and 2 mgm.

boron is placed in the groove 14. The substrate crystal 24 contained over 2000 parts per million nitrogen and was dark green and opaque. The bottom surface of the substrate crystal had been polished with ¼ micron diamond paste. The crystal had been etched in fused KOH at 600° C. for about 2 minutes. The "smooth" side was placed down on the pedestal. Resistivity of the crystal was approximately .05 ohm-cm. and the mobility approximately 30 cm.$^2$/v.-sec.

The tube 36 then was flushed with helium for 5 minutes. After flushing the helium gas flow was controlled at 2 cu. ft./hr. and the temperature raised to about 1600° C. for about 5 minutes. Thereafter the temperature was raised to 2400° C. for about 5 minutes.

During the high temperature portion of the run, the temperature was recorded at the indicated points (see FIG. 1) by optical pyrometer (corrected) as follows:

| | ° C. |
|---|---|
| Point A | 2400 |
| Point B | 2405 |
| Point C | 2410 |

These readings were taken by sighting on the susceptor chamber through a slit in the split heat shield 32.

The resultant crystal had a clear n layer approximately 0.2 mil thick (as measured by transmitted light) which was formed at 1600° C., the light n doping in this layer coming from the slight partial pressure of $N_2$ unavoidably existing in the reaction zone. A second layer about 2 mils thick was grown on the n layer during the high temperature (2400° C.) portion of the cycle. This second layer was p type and very opaque due to the addition of boron and aluminum to the silicon in the groove 14. The resultant product was a diode consisting of an opaque n$^+$ layer, a very thin (about 0.2 mil thick) transparent n layer and a p$^+$ layer substantially opaque on top of the transparent n layer. Both the n$^+$ and p$^+$ layers were provided with contacts in the manner described in the above copending applications.

A number of diodes produced by dicing the n$^+$-n-p$^+$ junction of Example 1 gave the following characteristics for a 40 x 40 mil die:

(1) Forward resistance $R_s$=1–10 ohms
(2) Reverse breakdown: 20–40 v. for 1 ma.
(3) $Q_E$ for yellow light: 1–2×10$^{-5}$ In the above example particular note should be taken of the simple, very effective, means for isolating the two differently doped masses of silicon within the same reaction zone. The pure silicon which was positioned at the top of the pedestal beneath the base crystal provided a slow epitaxial growth at 1600° C. This growth rate is about ⅒ that accomplished at 2400° C. during the second stage. This provides a very convenient method of controlling the thickness of the initial layer grown at the low temperature. This is particularly important when the resultant diode is to emit a very narrow line of light. The accurate control of the thickness of the initial layer can also be extremely important in other devices such as transistors and the like.

The effective complete isolation between the two masses of silicon is believed to be due to the much slower wetting rate of silicon on the pedestal which takes place at the lower temperature. At the 1600° C. temperature a very appreciable time (well in excess of 5 minutes) is required for silicon in the groove to wet the sides of the pedestal and creep up to the top of the crucible where its impurities can diffuse into the layer of liquid silicon existing between the top of the pedestal and the bottom of the silicon carbide seed crystal. Conversely, at the higher temperature, the wetting action is very rapid and the diffusion of the impurities from the remote mass of silicon into the silicon on top of the pedestal is also very rapid and this layer of silicon, from which the epitaxial growth is taking place, rapidly attains an impurity concentration approximating that in the mass of silicon within the groove 14.

Another advantage of the present invention is that the initial low temperature growth of the epitaxial layer is carried out at a sufficiently low temperature (e.g. 1600° C.) so that diffusion of impurities from the base crystal into the growing epitaxial layer is relatively minor. Accordingly, this layer can serve as a high purity substrate upon which a device structure can then be built by the subsequent higher temperature growth process in the second portion of the operation. In Example 1 this, in effect, is what happened, since a thin n layer is formed on an n$^+$ layer and a p$^+$ layer is subsequently grown at the higher temperature on the n layer. This provides for a much wider choice of seed crystals and they can be chosen for crystalline perfection rather than just for purity, assuming, of course, the seed crystal does not contain highly mobile or volatile impurities such as iron, copper or phosphorus which would diffuse into the initially grown low temperature epitaxial layer even at the relatively low temperature of 1600° C.

Another important aspect of the invention which is embodied in Example 1 is the very low forward resistance obtained with diodes produced therein. This is believed to be due to the fact that the p$^+$ layer was formed at 2400° C., a higher temperature than that described in parent application Ser. No. 810,977, filed Mar. 27, 1969, which discussed the importance of codoping with aluminum and boron. At this higher temperature, it is believed that the concentration of the boron in the grown epitaxial layer has been increased to the saturation limit (larger than 5×10$^{20}$ boron atoms/cm.$^3$). This higher concentration of boron in the epitaxial p$^+$ layer allows an increase in codoping of aluminum also in this layer, it being estimated that the aluminum concentration is about 5×10$^{19}$ to 1×10$^{20}$ atoms of aluminum/cm.$^3$. This relatively high concentration of aluminum (which is still only ⅕–⅒ the concentration of boron) provides for the very low resistivity of the p$^+$ type layer to give many diodes with only 1 or 2 ohms resistance. This is, accordingly, an extension of the teachings in my above parent application. It is noted that considerably more aluminum than boron is added to the heavily doped silicon from the groove; this being required because of the losses of aluminum from the melt due to its high vapor pressure at the operating temperature of 2400° C.

While one preferred embodiment of the invention has been described above, it is subject to considerable modification. The temperature range for the low temperature growth should be on the order of 1500° C.–1700° C., while the time of this growth is on the order of 1 minute (at 1700° C.) to about 15 minutes (at 1500° C.). Similarly, the high temperature growth can be achieved at a temperature of between about 2200° C. to 2600° C. As the temperature is increased above 2400° C., the time would generally be somewhat shorter than 5 minutes. As the temperature is lowered below 2400° C., the time, for an equivalent thickness of layer, must be increased appropriately.

As mentioned previously, the invention may be utilized for forming other types of devices. In the following examples, a number of different structures is produced.

Example 2

In this example the procedure is the same as in Example 1 above except that the starting crystal is a p$^+$ crystal containing about 1000 p.p.m. aluminum and the silicon in the groove 14 contains nitrogen as an n$^+$ dopant. A preferred method of incorporating the nitrogen is by use of silicon nitride ($Si_3N_4$). This provides a p$^+$-n-n$^+$ diode.

Example 3

This is similar to Example 2 above except that the silicon in the groove 14 contains boron and/or aluminum as a p dopant. This creates a three-layer p-n-p structure which can be formed into a transistor by providing suitable contacts to the individual layers.

Example 4

This is similar to Example 1 except that the silicon positioned between the seed crystal and the pedestal contains boron or aluminum as a p dopant, and the silicon in the groove 14 contains nitrogen as an n dopant. This gives an n-p-n structure which is also useful as a transistor.

Example 5

This is very similar to Example 1 except that the silicon in the groove 14 does not contain any boron. This produces an $n^+$-n-p diode which is doped only with aluminum. The resultant diode emits light in the blue portion of the spectrum having a peak at about 5000 A.

Example 6

This is similar to Example 3 in that p-n-p structure is created. However in this case the silicon in the groove 14 contains both boron and aluminum. Contacts are then made to both outer p layers and to the central n layer. When the junction diode comprising the $p^+$ base crystal (aluminum doped) and the epitaxial n layer is forward biased it will emit blue light. When the junction diode comprising the epitaxial n layer and the epitaxial p layer (boron plus aluminum) is forward biased, it will emit yellow light. Thus there is provided in a single small structure two sources of light having different wavelengths. Such a device can be used as a dual function indicator or recorder or a dual function switch when used in connection with detectors selectively sensitive to light of the two different wavelengths. Instead of making electrical contact to the central n layer, contacts need be made only to the two outer p layers. In this case, sufficient voltage is applied across the two p layers (including the n layer) so that one of the two p-n junctions will be forward biased and the other will be reverse biased, the total voltage exceeding the breakdown voltage of the reverse biased diode, thus permitting flow of current in the forward direction through one of the diodes. Reversal of the voltage will create forward current through the other diode.

Since certain changes may be made in the above process without departing from the scope of the invention herein involved, it is intended that all matter contained in the above description shall be interpreted as illustrative and not in a limiting sense.

What is claimed is:

1. In the method of growing a silicon carbide epitaxial layer on a silicon carbide seed crystal wherein the silicon carbide seed crystal contacts a carbon surface which may or may not be wetted with silicon, wetting said carbon surface with silicon prior to said contacting step or subsequent thereto such that said silicon exists as a molten layer in contact with said seed crystal and said carbon surface, providing a temperature gradient between said crystal and said molten layer, the carbon surface being hotter than the seed crystal, the seed crystal, carbon surface and silicon layer being maintained at sufficiently elevated temperature that there is solution of carbon at said carbon surface and epitaxial deposition of silicon carbide on a surface of said seed crystal, the improvement which comprises providing a first mass of silicon having one impurity concentration immediately between the carbon and a silicon carbide seed crystal supported thereon, and providing a second mass of silicon containing a different impurity concentration in a more remote portion of a reaction zone including said carbon surface, said two masses of silicon and said silicon carbide crystal, the reaction being carried out at two separate temperature levels, the first reaction (involving the first mass of silicon) being carried out at relatively low temperature on the order of 1500°–1700° C., the second reaction being carried out at a more elevated temperature on the order of 2200°–2600° C., at least the second reaction being accomplished in a zone having a temperature gradient less than about 10° C./inch, the second mass of silicon being separated from said first mass by a wettable surface constituting a path for travel of said second mass to said first mass at the higher temperature but constituting a substantial barrier for such travel at the lower temperature.

2. In the method of growing a p-type silicon carbide epitaxial layer on an "n" type silicon carbide base crystal to provide a p-n junction wherein said base crystal is placed on a carbon support and is heated to an elevated temperature of about 2400° C. while said carbon support is wet by silicon, said silicon containing an appreciable concentration of boron as a "p" type impurity, the carbon surface being hotter than the base crystal, the improvement which comprises adding aluminum to the silicon as a codopant, the aluminum concentration being substantially in excess of the boron concentration.

References Cited

UNITED STATES PATENTS

| | | | |
|---|---|---|---|
| 3,205,101 | 9/1965 | Mlavsky et al. | 148—175 |
| 3,360,406 | 12/1967 | Sumski | 148—1.6 |
| 3,458,779 | 7/1969 | Blank et al. | 317—234 |
| 3,462,321 | 8/1969 | Vitkus | 148—172 |
| 3,565,703 | 2/1971 | Kamath | 148—172 |

OTHER REFERENCES

Patrick, L., "Structure and Characteristics of Silicon Carbide Light-Emitting Junctions," J. Appl. Physics, vol. 28, No. 7, July 1957, pp. 765–776.

L. DEWAYNE RUTLEDGE, Primary Examiner

W. G. SABA, Assistant Examiner

U.S. Cl. X.R.

23—208, 301; 117—201; 148—1.5, 1.6, 171, 173, 177; 317—234 R